United States Patent
Lin (10) Patent No.: US 9,837,974 B2
(45) Date of Patent: Dec. 5, 2017

(54) AMPLIFIER SYSTEM AND METHOD FOR CONTROLLING AMPLIFIER

(71) Applicant: MEDIATEK INC., Hsin-Chu (TW)

(72) Inventor: Lai-Ching Lin, Hsinchu County (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 15/238,729

(22) Filed: Aug. 17, 2016

(65) Prior Publication Data

US 2017/0141747 A1 May 18, 2017

Related U.S. Application Data

(60) Provisional application No. 62/254,196, filed on Nov. 12, 2015.

(51) Int. Cl.
| H03F 3/45 | (2006.01) |
| H03G 3/30 | (2006.01) |
| H03F 3/21 | (2006.01) |
| H03F 3/193 | (2006.01) |

(52) U.S. Cl.
CPC ........... *H03G 3/3042* (2013.01); *H03F 3/193* (2013.01); *H03F 3/21* (2013.01); *H03F 3/45179* (2013.01); *H03F 2200/451* (2013.01); *H03F 2200/462* (2013.01); *H03F 2200/541* (2013.01)

(58) Field of Classification Search
CPC .................................... H03F 3/45; H03G 3/30
USPC .................................................. 330/254, 261
See application file for complete search history.

(56) References Cited

U.S. PATENT DOCUMENTS

| 6,118,318 | A | * | 9/2000 | Fifield | .................. | H03K 3/3525 |
| | | | | | | 326/27 |
| 7,109,897 | B1 | | 9/2006 | Levesque | | |
| 7,486,137 | B2 | | 2/2009 | Magoon et al. | | |
| 7,649,411 | B2 | | 1/2010 | Aoki et al. | | |
| 8,749,309 | B2 | | 6/2014 | Ho et al. | | |
| 8,791,760 | B2 | | 7/2014 | Nadimpalli et al. | | |
| 8,928,364 | B2 | | 1/2015 | Wimpenny et al. | | |
| 2004/0075501 | A1 | | 4/2004 | Takahashi | | |
| 2004/0246056 | A1 | | 12/2004 | Behzad | | |
| 2010/0073090 | A1 | | 3/2010 | Mattos | | |
| 2012/0081179 | A1 | | 4/2012 | Visser | | |

* cited by examiner

Primary Examiner — Steven J Mottola
(74) Attorney, Agent, or Firm — Winston Hsu (57) ABSTRACT

An amplifier system includes a main amplifier, a cross-over current detector and a controller. The main amplifier includes at least a first driving transistor and a second driving transistor serving as a differential pair, wherein the first driving transistor and the second driving transistor are arranged to receive a first input signal and a second input signal, respectively. The cross-over current detector is coupled to the main amplifier, and is arranged for detecting a cross-over current of the main amplifier, wherein the cross-over current of the main amplifier is an overlapped current from the differential pair. The controller is coupled to the main amplifier and the cross-over current detector, and is arranged for generating a control signal to control a gain of the main amplifier according to an output of the main amplifier and the cross-over current of the main amplifier.

18 Claims, 6 Drawing Sheets

AMPLIFIER SYSTEM AND METHOD FOR CONTROLLING AMPLIFIER

CROSS REFERENCE TO RELATED APPLICATIONS

This application claims the priority of U.S. Provisional Application No. 62/254,196, filed on Nov. 12, 2015, which is included herein by reference in its entirety.

BACKGROUND

In an ideal differential amplifier system, two input signals are in inverted phases, meaning that two differential power transistors are not simultaneously turned on. However, due to the process, voltage and temperature (PVT) variation effects, phases of the two input signals may not be precisely controlled so that the two differential power transistors are simultaneously turned on, thereby a cross-over current (i.e. overlapped current) is generated. The cross-over current can be regarded as a dissipated current, and only contributes power loss. In addition, when a feedback loop is applied to control a gain of the amplifier, the cross-over current may affect an accuracy of the gain control.

SUMMARY

It is therefore an objective of the present invention to provide an amplifier system, which detects the cross-over current and refers to the detected cross-over current to control the gain of the amplifier system, to solve the above-mentioned problems.

According to one embodiment of the present invention, an amplifier system comprises a main amplifier, a cross-over current detector and a controller. The main amplifier comprises at least a first driving transistor and a second driving transistor serving as a differential pair, wherein the first driving transistor and the second driving transistor are arranged to receive a first input signal and a second input signal, respectively. The cross-over current detector is coupled to the main amplifier, and is arranged for detecting a cross-over current of the main amplifier, wherein the cross-over current of the main amplifier is an overlapped current from the differential pair. The controller is coupled to the main amplifier and the cross-over current detector, and is arranged for generating a control signal to control a gain of the main amplifier according to an output of the main amplifier and the cross-over current of the main amplifier.

According to another embodiment of the present invention, a method for controlling a main amplifier is provided, wherein the main amplifier comprises at least a first driving transistor and a second driving transistor serving as a differential pair, and the first driving transistor and the second driving transistor are arranged to receive a first input signal and a second input signal, respectively, and the method comprises: detecting a cross-over current of the main amplifier, wherein the cross-over current of the main amplifier is an overlapped current from the differential pair; and generating a control signal to control a gain of the main amplifier according to an output of the main amplifier and the cross-over current of the main amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
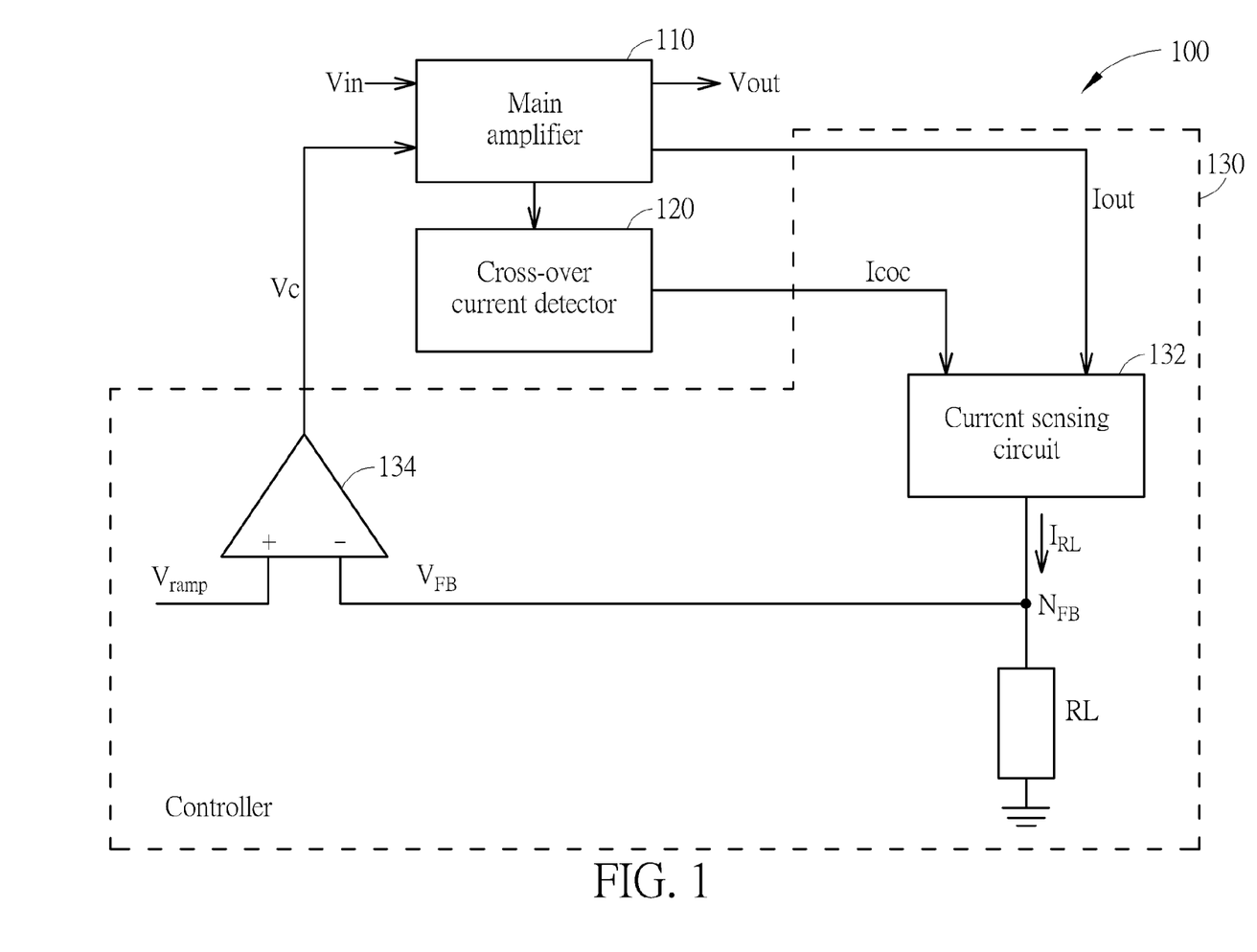
FIG. 1 is a diagram illustrating an amplifier system according to one embodiment of the present invention.

Please refer to FIG. 1, which is a diagram illustrating an amplifier system 100 according to one embodiment of the present invention. As shown in FIG. 1, the amplifier system 100 comprises a main amplifier 110, a cross-over current detector 120 and a controller 130, where the controller 130 comprises a current sensing circuit 132, a load circuit RL and an operational amplifier 134. The main amplifier 110 is configured to amplify a radio frequency (RF) input signal Vin to generate an RF output signal Vout. The cross-over current detector 120 is configured to detect a cross-over current Icoc of the main amplifier 110. The controller 130 is configured to generate a control signal Vc to control a gain of the main amplifier 110 according to a power indication signal Vramp, a total output current Iout of the main amplifier 110 and the cross-over current Icoc of the main amplifier 110. In this embodiment, the amplifier system 100 is applied to a transmitter, and the output signal Vout is broadcasted by using an antenna coupled to the main amplifier 110.

In this embodiment, because the cross-over current Icoc can be regarded as a dissipated current and only contributes power loss, therefore, the current sensing circuit 132 provides a sensed current $I_{RL}$ related to a difference between an output current Iout and the cross-over current Icoc, that is the sensed current $I_{RL}$ is related to an effective current of the main amplifier 110, and the operational amplifier 134 generates the control signal Vc according to the power indication signal Vramp and a feedback voltage $V_{FB}$ generated according to the sensed current $I_{RL}$ and the load circuit RL ($V_{FB}=I_{RL}*RL$).

Figure 2:
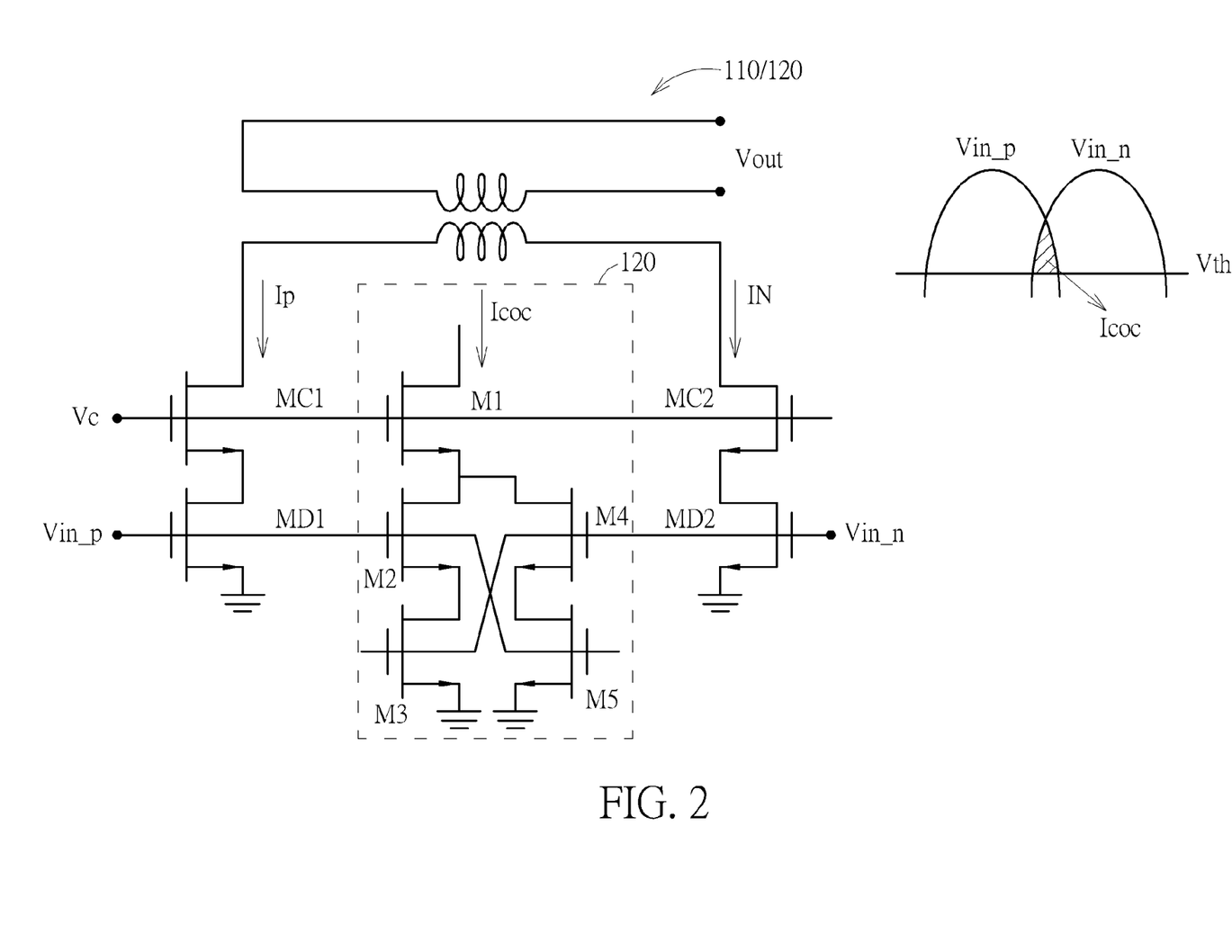
FIG. 2 shows a detailed structure of the main amplifier and the cross-over current detector according to one embodiment of the present invention.

FIG. 2 shows a detailed structure of the main amplifier 110 and the cross-over current detector 120 according to one embodiment of the present invention. As shown in FIG. 2, the main amplifier 100 comprises a first driving transistor MD1 and a first control transistor MC1 connected in cascode, a second driving transistor MD2 and a second control transistor MC1 connected in cascode, and a transformer. The first driving transistor MD1 and the second driving transistor MD2 serve as a differential pair, and are arranged to receive a first input signal Vin_p and a second input signal Vin_n, respectively, to generate the output signal Vout; the first control transistor MC1 is used to control a current/gain of the first driving transistor MD1 according to the control signal Vc; and the second control transistor MC2 is used to control a current/gain of the second driving transistor MD2 according to the control signal Vc. In addition, the cross-over current detector 120 comprises five transistors M1-M5, where the transistor M1 is controlled by the control signal Vc, the transistors M2 and M3 are connected in cascode, the transistors M4 and M5 are connected in cascode, the transistors M2 and M5 are controlled by the first input signal Vin_p, and the transistors M3 and M4 are controlled by the second input signal Vin_n.

Ideally, the first input signal Vin_p and the second input signal Vin_n are inverted signals, meaning that the phase difference between the first input signal Vin_p and the second input signal Vin_n should be 180 degrees. However, due to the PVT variation effects, phases of the first input signal Vin_p and the second input signal Vin_n may not be precisely controlled to make that the first/second driving transistors MD1/MD2 are simultaneously turned on, thereby the cross-over current Icoc (i.e. overlapped current) is generated. The right side of FIG. 2 shows that the cross-over current Icoc is generated when voltage levels of both the first input signal Vin_p and the second input signal Vin_n are greater than the threshold voltage Vth of the first driving transistor MD1 and the second driving transistor MD2 (it is assumed that the transistors MD1 and MD2 have the same threshold voltage Vth).

Figure 3:
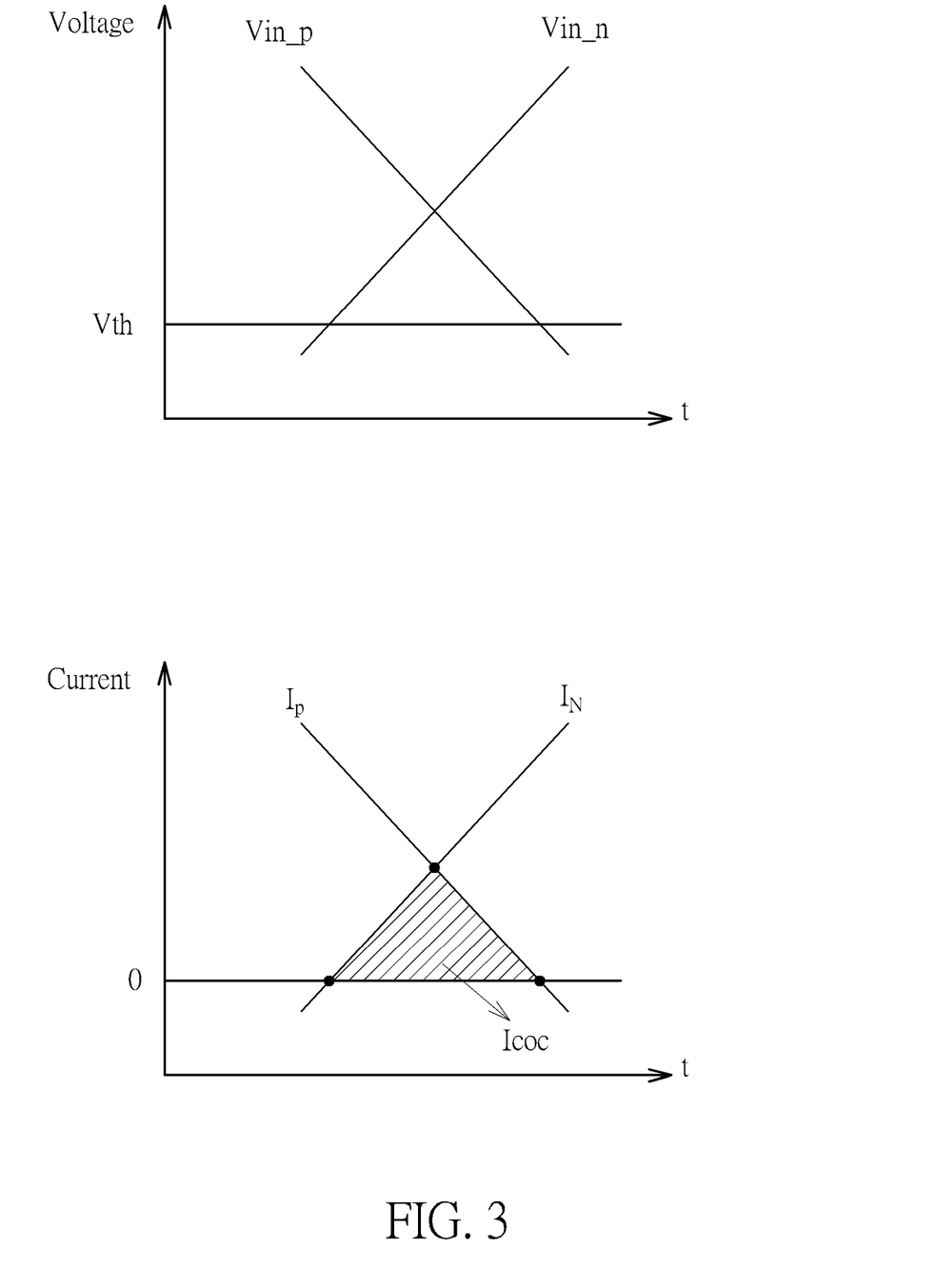
FIG. 3 shows relationship between the cross-over current, the first input signal, the second input signal, a current flowing through the first driving transistor and the current flowing through the second driving transistor according to one embodiment of the present invention.

In the cross-over current detector 120 shown in FIG. 2, because the transistors M2 and M3 connected in cascode are controlled by the first input signal Vin_p and the second input signal Vin_n, respectively, and the transistors M4 and M5 connected in cascode are controlled by the second input signal Vin_n and the first input signal Vin_p, respectively, the transistor M1 has a current only when the both the first input signal Vin_p and the second input signal Vin_n are greater than the threshold voltage Vth of the transistors M2-M5. Therefore, if the designs of the transistors M2-M5 is substantially equal to or similar to the first/second driving transistors MD1 and MD1/MD2 (i.e. the threshold voltages are substantially the same), the current flowing through the transistor M1 can be regarded as the cross-over current Icoc occurred on the main amplifier 110. In addition, FIG. 3 shows relationship between the cross-over current Icoc, the first input signal Vin_p, the second input signal Vin_n, a current $I_P$ flowing through the first driving transistor MD1 and a current $I_N$ flowing through the second driving transistor MD2 according to one embodiment of the present invention.

Figure 4:
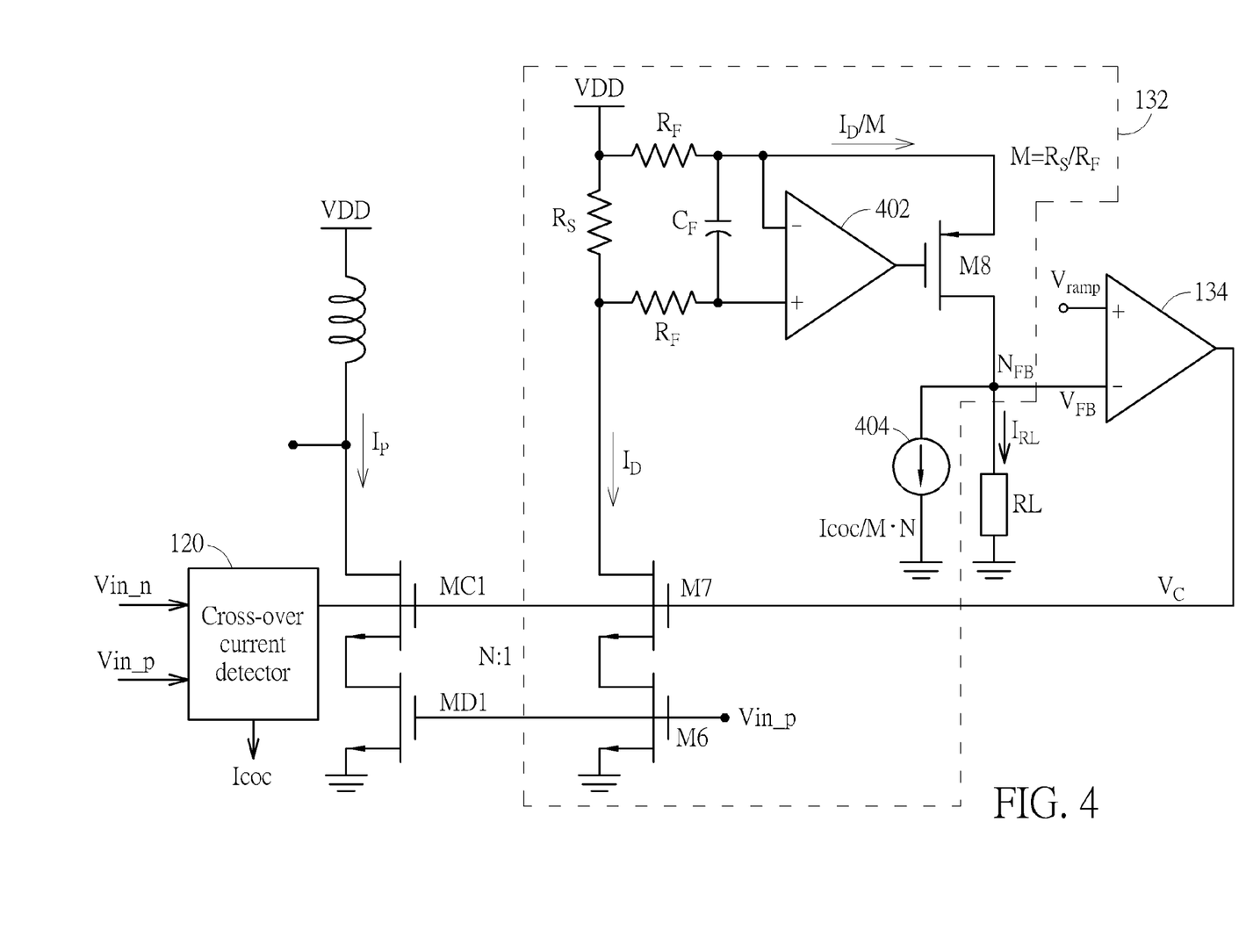
FIG. 4 shows a detailed structure of the main amplifier and the controller according to one embodiment of the present invention.

FIG. 4 shows a detailed structure of the main amplifier 110 and the controller 130 according to one embodiment of the present invention. For simplicity, FIG. 4 merely shows half of the main amplifier 110. As shown in FIG. 4, the current sensing circuit 132 comprises transistors M6-M8, resistors Rs and $R_F$, a capacitor $C_F$ and a control amplifier 402, and the current sensing circuit 132 is configured to provide a relationship between the current $I_P$ flowing through the main amplifier 110 and the sensed current $I_{RL}$.

In one embodiment, an intermediate current $I_D$ is a ratio (1/N) multiplying with the current $I_P$ flowing through the main amplifier 110 (i.e. $I_D=I_P/N$), and the current flowing through the transistor M8 is a ratio (1/M) multiplying the intermediate current $I_D$, where N and M are any designed positive integers; and by using a current source 404 having the current equal to (Icoc/(M*N)), the sensed current IRL flowing through the feedback node NFB and the load circuit RL is proportional to the effective current of the main amplifier, that is $I_{RL}=(I_P-Icoc)/(M*N)$. Then, the feedback voltage $V_{FB}$ is generated according to the sensed current $I_{RL}$ and the load circuit RL, and the operational amplifier 134 compares the power indication signal Vramp with the feedback voltage $V_{FB}$ to generate the control signal Vc to control the current/gain of the main amplifier 110. It is noted that the main amplifier 110 and the current sensing circuit 132 shown in FIG. 4 are for illustrative purpose only, as long as the current sensing circuit 132 can provide the sensed current $I_{RL}$ that is associated with the difference between the output current Iout and the cross-over current Icoc, the current sensing circuit 132 can be implemented by any other circuit designs.

In light of above, because the feedback voltage $V_{FB}$ is generated according to the effective output current of the main amplifier 110 (i.e. according to difference between the output current Iout and the cross-over current Icoc), the gain control of the amplifier system 100 will be more accurately.

Figure 5:
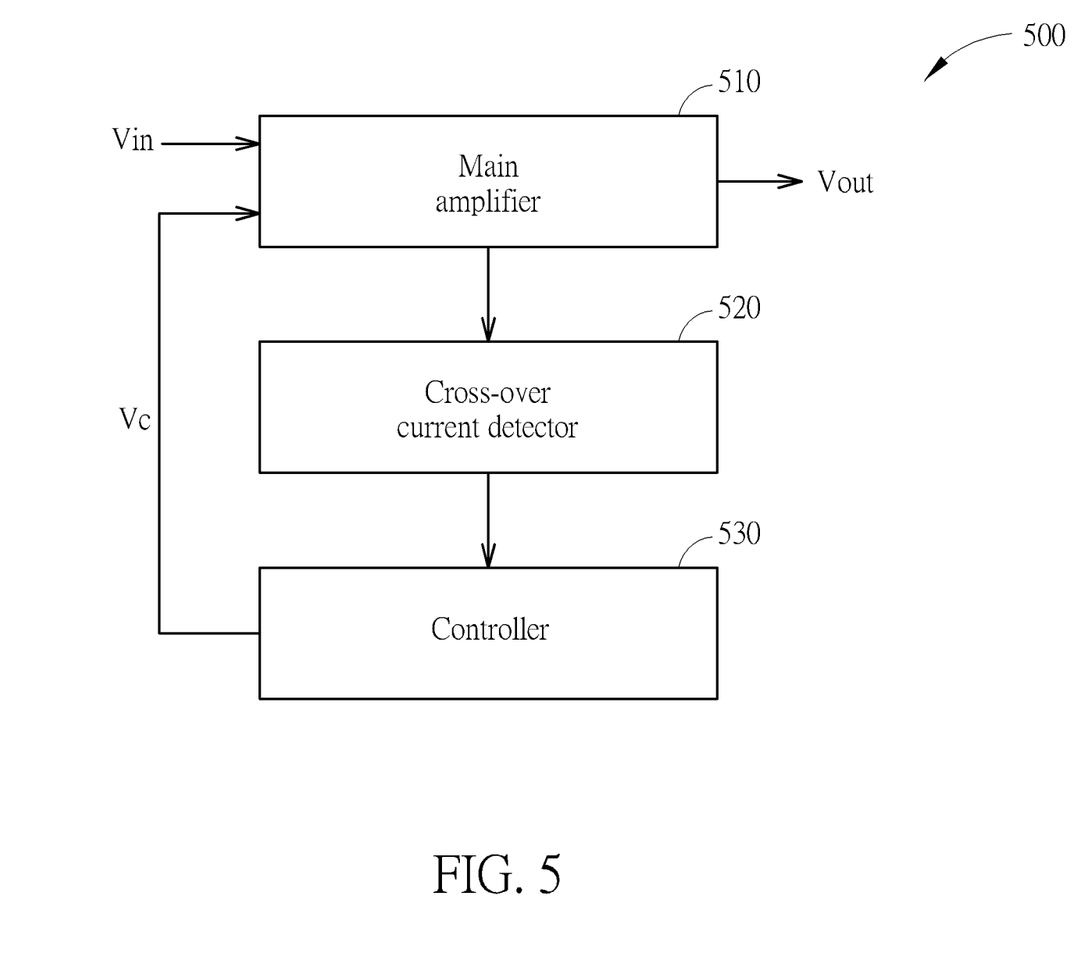
FIG. 5 is a diagram illustrating an amplifier system according to another embodiment of the present invention.

In addition, besides the above-mentioned feedback control, the cross-over current Icoc may also be used to control a bias voltage of the amplifier to improve the efficiency of the power amplifier. Please refer to FIG. 5, which is a diagram illustrating an amplifier system 500 according to another embodiment of the present invention. As shown in FIG. 5, the amplifier system 500 comprises a main amplifier 510, a cross-over current detector 520 and a controller 530. The main amplifier 510 is configured to amplify a radio frequency (RF) input signal Vin to generate an RF output signal Vout. The cross-over current detector 520 is configured to detect a cross-over current of the main amplifier 510. The controller 530 is configured to generate at least a control signal Vc to control a gain of the main amplifier 510 according to at least the cross-over current of the main amplifier 510. In this embodiment, the amplifier system 500 is applied to a transmitter, and the output signal Vout is broadcasted by using an antenna coupled to the main amplifier 510.

Figure 6:
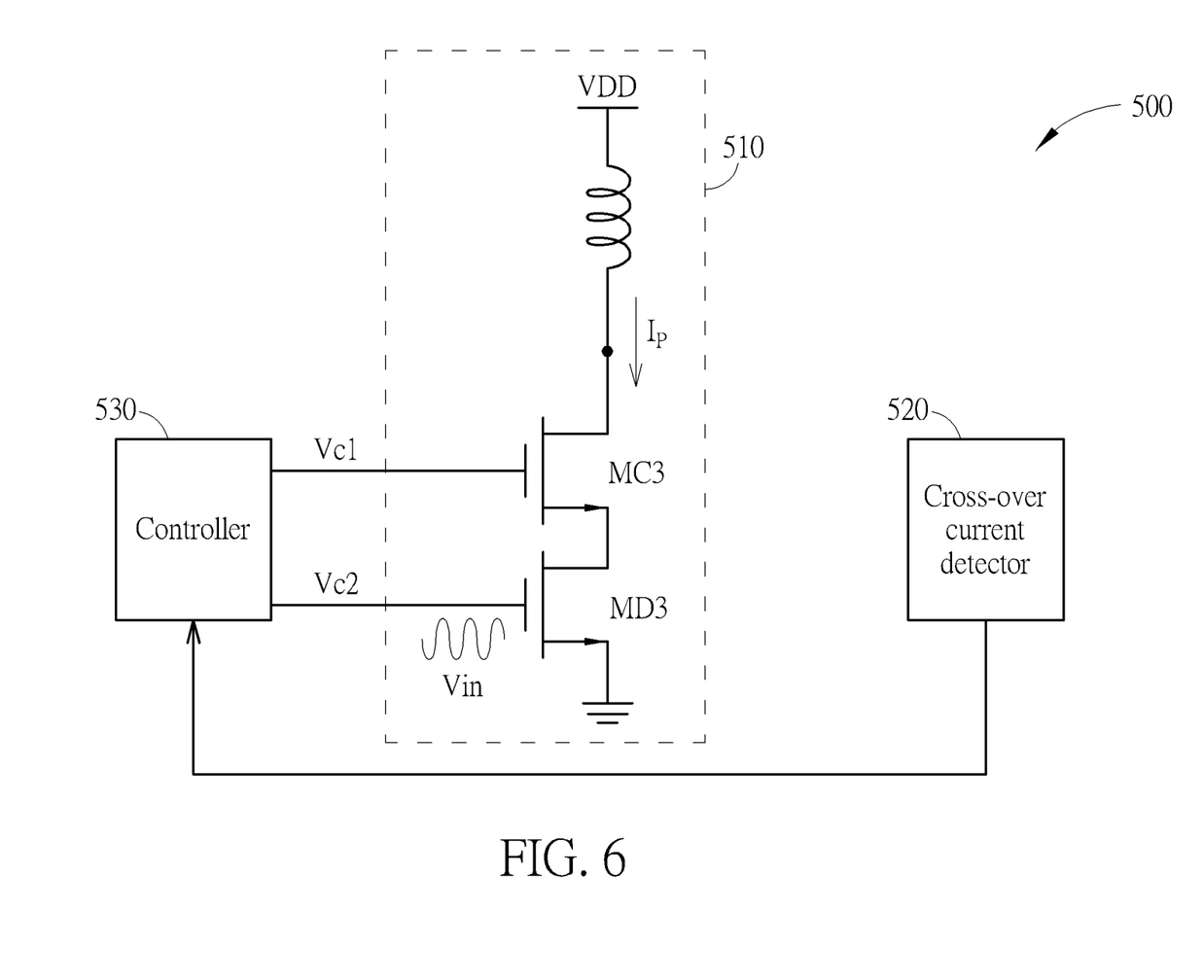
FIG. 6 shows a detailed structure of the amplifier system shown in FIG. 5.

FIG. 6 shows a detailed structure of the amplifier system 500 shown in FIG. 5. In FIG. 6, the main amplifier 510 may have the same circuit structure as the main amplifier 110 shown in FIG. 2, but for simplicity, the main amplifier 510 shown in FIG. 6 only shows half of the circuits, that is the main amplifier 510 comprises two transistors MD3 and MC3 connected in cascode, and the transistors MD3 and MC3 are supplied by a supply voltage VDD via an inductor. The operation of the cross-over current detector 520 is the same as the cross-over current detector 120 shown in FIG. 1. The controller 530 serves as a bias driving circuit, and the controller 530 is arranged to provide two control signals (i.e. two bias voltages) Vc1 and Vc2 to gate electrodes of the transistors MC3 and MD3, respectively.

In the embodiment shown in FIG. 6, the controller 530 controls the output current $I_P$ or the gain of the main amplifier 510 according to information of the cross-over current detected by the cross-over current detector 520. In detail, once the cross-over current is detected or the cross-over current is greater than a threshold, the controller 530 may lower the bias voltage Vc1 or lower the bias voltage Vc2 to decrease the output current $I_P$ of the main amplifier 510, to improve the efficiency of the main amplifier 510.

Briefly summarized, in the amplifier system of the present invention, the cross-over current can be accurately detected, and the information of the cross-over current may be used to control the gain of the amplifier. By using the embodiments of the present invention, the power control of the main amplifier can be more accurate, and/or the efficiency of the main amplifier can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier system, comprising:
    a main amplifier comprising at least a first driving transistor and a second driving transistor serving as a differential pair, wherein the first driving transistor and the second driving transistor are arranged to receive a first input signal and a second input signal, respectively;
    a cross-over current detector, coupled to the main amplifier, for detecting a cross-over current of the main amplifier, wherein the cross-over current of the main amplifier is an overlapped current from the differential pair; and
    a controller, coupled to the main amplifier and the cross-over current detector, for generating a control signal to control a gain of the main amplifier according to at least the cross-over current of the main amplifier.

2. The amplifier system of claim 1, wherein the controller generates the control signal to control the gain of the main amplifier according to a difference between an output current of the main amplifier and the cross-over current of the main amplifier.

3. The amplifier system of claim 1, wherein the main amplifier further comprises a first control transistor and a second control transistor, the first driving transistor and the first control transistor are coupled in cascode, the second driving transistor and the second control transistor are coupled in cascode, and the controller generates the control signal to gate electrodes of the first control transistor and the second control transistor to control the gain of the main amplifier.

4. The amplifier system of claim 3, wherein the controller generates the control signal according to a difference between an output current of the main amplifier and the cross-over current of the main amplifier, to the gate electrodes of the first control transistor and the second control transistor to control the gain of the main amplifier.

5. The amplifier system of claim 3, wherein the cross-over current detector comprises:
    a first transistor, controlled by the control signal generated by the controller;
    a second transistor and a third transistor connected in cascode, wherein the second transistor is coupled to the first transistor, and the second transistor and the third transistor receive the first input signal and the second input signal, respectively; and
    a fourth transistor and a fifth transistor connected in cascode, wherein the fourth transistor is coupled to the first transistor, and the fourth transistor and the fifth transistor receive the second input signal and the first input signal, respectively;
    wherein a current of the first transistor serves as the cross-over current of the main amplifier.

6. The amplifier system of claim 1, wherein the controller comprises:
    a current sensing circuit, for providing a sensed current related to a difference between an output current of the main amplifier and the cross-over current;
    a load circuit, coupled to the current sensing circuit via a node, wherein the sensed current flows through the node and the load circuit to provide a loading voltage; and
    an operational amplifier, coupled to the node and the main amplifier, for receiving a power indication signal and the loading voltage to generate the control signal to control the gain of the main amplifier.

7. The amplifier system of claim 1, wherein the controller generates the control signal to bias gate electrodes of the first driving transistor and the second driving transistor according to the cross-over current of the main amplifier.

8. The amplifier system of claim 7, wherein once the cross-over current is detected or the cross-over current is greater than a threshold, the controller lowers a voltage level of the control signal.

9. The amplifier system of claim 7, wherein the main amplifier further comprises a first control transistor and a second control transistor, the first driving transistor and the first control transistor are connected in cascode, the second driving transistor and the second control transistor are connected in cascode, and the controller further generates another control signals to bias gate electrodes of the first control transistor and the second control transistor according to the cross-over current of the main amplifier.

10. The amplifier system of claim 9, wherein once the cross-over current is detected or the cross-over current is greater than a threshold, the controller lowers the voltage levels of the control signal and the other control signal.

11. A method for controlling a main amplifier, wherein the main amplifier comprises at least a first driving transistor and a second driving transistor serving as a differential pair, and the first driving transistor and the second driving transistor are arranged to receive a first input signal and a second input signal, respectively, and the method comprises:
    detecting a cross-over current of the main amplifier, wherein the cross-over current of the main amplifier is an overlapped current from the differential pair; and
    generating a control signal to control a gain of the main amplifier according to at least the cross-over current of the main amplifier.

12. The method of claim 11, wherein the step of generating the control signal comprises:
    generating the control signal to control the gain of the main amplifier according to a difference between an output current of the main amplifier and the cross-over current of the main amplifier.

13. The method of claim 11, wherein the main amplifier further comprises a first control transistor and a second control transistor, the first driving transistor and the first control transistor are connected in cascode, the second driving transistor and the second control transistor are connected in cascode, and the step of generating the control signal to control the gain of the main amplifier comprises:
    generating the control signal to gate electrodes of the first control transistor and the second control transistor to control the gain of the main amplifier.

14. The method of claim 13, wherein the step of generating the control signal to control the gain of the main amplifier comprises:

generating the control signal according to a difference between an output current of the main amplifier and the cross-over current of the main amplifier, to the gate electrodes of the first control transistor and the second control transistor to control the gain of the main amplifier.

15. The method of claim 11, wherein the step of generating the control signal to control the gain of the main amplifier comprises:

generating the control signal to bias gate electrodes of the first driving transistor and the second driving transistor according to the cross-over current of the main amplifier.

16. The method of claim 15, wherein the step of generating the control signal to bias the gate electrodes of the first driving transistor and the second driving transistor comprises:

once the cross-over current is detected or the cross-over current is greater than a threshold, lowering a voltage level of the control signal.

17. The method of claim 15, wherein the main amplifier further comprises a first control transistor and a second control transistor, the first driving transistor and the first control transistor are connected in cascode, the second driving transistor and the second control transistor are connected in cascode, and the method further comprises:

generating another control signal to bias gate electrodes of the first control transistor and the second control transistor according to the cross-over current of the main amplifier.

18. The method of claim 17, wherein the steps of generating the control signal and generating the other control signal each comprises:

once the cross-over current is detected or the cross-over current is greater than a threshold, lowering voltage levels of the control signal and the other control signal.

* * * * *